US010932401B2

(12) United States Patent
Yamakage et al.

(10) Patent No.: US 10,932,401 B2
(45) Date of Patent: Feb. 23, 2021

(54) COMPONENT MOUNTING MACHINE (71) Applicant: FUJI CORPORATION, Chiryu (JP)

(72) Inventors: Yusuke Yamakage, Anjo (JP);
Yoshiyuki Fukaya, Chiryu (JP)

(73) Assignee: FUJI CORPORATION, Chiryu (JP)

(*) Notice: Subject to any disclaimer, the term of this patent is extended or adjusted under 35 U.S.C. 154(b) by 372 days.

(21) Appl. No.: 15/740,074

(22) PCT Filed: Jul. 23, 2015

(86) PCT No.: PCT/JP2015/070929
§ 371 (c)(1),
(2) Date: Dec. 27, 2017

(87) PCT Pub. No.: WO2017/013781
PCT Pub. Date: Jan. 26, 2017

(65) Prior Publication Data
US 2018/0192558 A1     Jul. 5, 2018

(51) Int. Cl.
H05K 13/08    (2006.01)
H05K 13/04    (2006.01)
G06T 7/73     (2017.01)

(52) U.S. Cl.
CPC .......... H05K 13/0413 (2013.01); G06T 7/74 (2017.01); H05K 13/0409 (2018.08); H05K 13/083 (2018.08)

(58) Field of Classification Search
CPC .. H05K 13/08; H05K 13/0404; H05K 13/046; H05K 13/04; H05K 13/0413;
(Continued)

(56) References Cited

U.S. PATENT DOCUMENTS 4,980,971 A * 1/1991 Bartschat ............ H01L 21/681
                                            29/833
5,084,959 A * 2/1992 Ando ................. H01L 21/681
                                            29/740
(Continued)

FOREIGN PATENT DOCUMENTS

JP       6-117815 A     4/1994
JP    2009-54821 A     3/2009
(Continued)

OTHER PUBLICATIONS

International Search Report dated Oct. 27, 2015 in PCT/JP2015/070929 filed Jul. 23, 2015.

Primary Examiner — Peter Dungba Vo
Assistant Examiner — Kaying Kue
(74) Attorney, Agent, or Firm — Oblon, McClelland, Maier & Neustadt, L.L.P.

(57) ABSTRACT

There is provided a component mounting machine in which when detecting a lowermost end position of a component sucked by a suction nozzle, a lower edge position of the component is detected at predetermined intervals from a left side and a right side using the lowermost end position as a reference. The component mounting machine derives an approximate straight line obtained by approximating multiple lower edge positions detected from the side having a larger detection number and the lowermost end position and an angle of the approximate straight line is detected as the suction angle of the component. Accordingly, the component mounting machine can appropriately detect the suction angle of the component with a simple process and correctly determine the suction posture of the component.

7 Claims, 9 Drawing Sheets (58) Field of Classification Search
CPC ............... H05K 13/0408; H05K 13/02; H05K 13/0469; H05K 13/0015; G06T 7/74; Y10T 29/53174; Y10T 29/53178; Y10T 29/53183; Y10T 29/53191; Y10T 29/53039
USPC .......................................... 29/739, 833, 743
See application file for complete search history.

(56) References Cited

U.S. PATENT DOCUMENTS

| | | | | |
|---|---|---|---|---|
| 5,379,514 | A * | 1/1995 | Okuda | H05K 13/0882 29/833 |
| 5,541,834 | A * | 7/1996 | Tomigashi | H05K 13/0812 700/59 |
| 5,694,219 | A * | 12/1997 | Kim | H05K 13/0812 356/615 |
| 5,956,134 | A * | 9/1999 | Roy | H05K 13/0813 356/237.5 |
| 6,002,650 | A * | 12/1999 | Kuribayashi | G05B 19/4097 700/117 |
| 6,118,540 | A * | 9/2000 | Roy | G01N 21/88 356/394 |
| 6,144,452 | A * | 11/2000 | Hachiya | G01B 11/14 356/615 |
| 6,212,751 | B1 * | 4/2001 | Hattori | G05B 19/402 29/407.04 |
| 6,222,629 | B1 * | 4/2001 | Morris | G01B 11/2433 356/601 |
| 6,230,398 | B1 * | 5/2001 | Murata | H05K 13/0413 29/832 |
| 6,334,115 | B1 * | 12/2001 | Kuribayashi | H05K 13/085 705/27.2 |
| 6,519,838 | B1 * | 2/2003 | Okuda | H05K 13/0409 29/740 |
| 6,538,244 | B1 * | 3/2003 | Skunes | H05K 13/0812 250/208.1 |
| 6,538,750 | B1 * | 3/2003 | Fishbaine | H05K 13/0812 356/614 |
| 6,606,788 | B1 * | 8/2003 | Morimoto | H05K 13/0813 29/832 |
| 6,868,603 | B2 * | 3/2005 | Okuda | H05K 13/0409 29/832 |
| 7,127,459 | B2 * | 10/2006 | Kuribayashi | G06F 30/00 |
| 8,019,455 | B2 * | 9/2011 | Maenishi | H05K 13/085 700/99 |
| 8,553,080 | B2 * | 10/2013 | Endo | H05K 13/041 348/87 |
| 8,925,188 | B2 * | 1/2015 | Nishino | H05K 3/305 29/740 |
| 9,001,201 | B2 * | 4/2015 | Yamasaki | H05K 13/041 348/87 |
| 9,001,202 | B2 * | 4/2015 | Yamasaki | H05K 13/0812 348/92 |
| 9,332,686 | B2 * | 5/2016 | Yamashita | H05K 13/0812 |
| 2002/0029468 | A1 * | 3/2002 | Koike | H05K 13/0413 29/832 |
| 2002/0073536 | A1 * | 6/2002 | Okuda | H05K 13/041 29/740 |
| 2002/0124399 | A1 * | 9/2002 | Ogimoto | H01L 21/681 29/833 |
| 2002/0138974 | A1 * | 10/2002 | Suhara | H05K 13/0812 29/740 |
| 2004/0080897 | A1 * | 4/2004 | Kodama | H05K 13/0882 361/234 |
| 2007/0074390 | A1 * | 4/2007 | Ota | H05K 13/041 29/833 |
| 2010/0229380 | A1 * | 9/2010 | Endo | H05K 13/0409 29/760 |
| 2010/0257728 | A1 * | 10/2010 | Hiraki | H01L 24/743 29/739 |
| 2010/0321487 | A1 | 12/2010 | Endo et al. | |

FOREIGN PATENT DOCUMENTS

JP 4998148 B2 8/2012
JP 2015-70176 A 4/2015

* cited by examiner

FIG. 9

COMPONENT MOUNTING MACHINE

TECHNICAL FIELD

The present application relates to a component mounting machine.

BACKGROUND ART

In the related art, there has been known a component mounting machine that mounts a component sucked by a suction nozzle on a board and determines whether or not a suction posture of the component is good based on an image obtained by imaging the sucked component from the side. For example, the component mounting machine in PTL 1 detects the heights at positions of any two points of a component from an image and determines whether or not a suction posture of the component is good by determining whether there is an inclined section at a lower edge of the component based on the difference between the heights of the two detected points.

CITATION LIST

Patent Literature

PTL 1: Japanese Patent No. 4998148

SUMMARY

Technical Problem

However, there is a case where it cannot be correctly determined whether or not there is an inclined section at a lower edge of the component depending on a position at which the heights of two points are detected. For example, when it is considered that a component having a rectangular shape in side view is inclined, there is a case where a height of a point on one side and a height of a point on the other side among two sides interposing one vertex which is the lowermost end are detected as the heights of two points. In that case, since there may be little difference in height between the two points, there is a case where it is difficult to correctly determine whether or not there is an inclined section on a lower edge.

A main object of the disclosure is to appropriately detect a suction angle of the sucked component and correctly determine the suction posture of the component.

Solution to Problem

According to the disclosure, there is provided a component mounting machine including: a head that has a suction nozzle which sucks a component; an imaging device that is disposed on a side of the suction nozzle; and a control device that controls the imaging device so as to image the component sucked by the suction nozzle from the side and controls the head so as to mount the component on a mounting target after determining a suction posture of the component based on the image obtained by imaging, in which the control device detects a plurality of positions of lower edges including a lowermost end position of the component from the image, detects a suction angle of the component sucked by the suction nozzle based on a multiple detection positions including the lowermost end position, and determines the suction posture of the component based on the suction angle.

The component mounting machine according to the disclosure detects the plurality of positions of the lower edges including the lowermost end position of the component from the image obtained by imaging the component sucked by the suction nozzle from the side, detects the suction angle of the component based on the multiple detection positions including the lowermost end position, and determines the suction posture of the component based on the suction angle. Accordingly, in a case where the component is inclined since multiple lower edge positions including the lowermost end position are different in an up-down direction, it is possible to appropriately detect the suction angle of the components and correctly determine the suction posture of the component.

In addition, in the component mounting machine of the disclosure, the control device can detect the height of the component based on the lowermost end position to determine whether or not there is height defect of the component, and detect the suction angle with respect to the component that is determined to have no height defect. Here, depending on a state of component suction, although the detected height generally falls within a reference value, there is a case where the component is actually sucked in an inclined state. Therefore, by detecting the suction angle of the component that is determined to have no height defect, it is possible to correctly determine the suction posture of the component. The component that is determined to have height defect is not to be detected the suction angle and that the suction posture thereof is assumed to be defective and the component cannot be mounted.

In addition, in the component mounting machine of the disclosure, the control device can obtain an approximate straight line by approximating the multiple detection positions to a straight line and detect an angle of the approximate straight line with respect to a predetermined reference line as the suction angle. In this way, the suction angle can be accurately detected with a simple method.

In addition, in the component mounting machine of the disclosure, the component has a short side in a height direction and a long side in a lateral direction with one corner portion interposed therebetween in a side view, and the control device can detect the position of the lower edge of the component at predetermined intervals to the left side, detect the position of the lower edge of the component at predetermined intervals to the right side using the lowermost end position as a reference, and set the position of the lower edge of a side with larger detection number of the left side and the right side and the lowermost end position as the multiple detection positions. In this way, since the position of the lower edge detected from the short side in the height direction is used and thus erroneous detection of the suction angle of the component can be prevented when one corner portion is the lowermost end position, the suction angle of the component can be appropriately detected.

In addition, in the component mounting machine of the disclosure, the control device can control the head so as not to mount the component on the mounting target in a case where the control device determines that the suction posture of the component is defective because the suction angle exceeds a predetermined allowable range. In this way, it is possible to prevent the component from being mounted in a relatively largely inclined state and to reduce mounting defect of the component.

In addition, in the component mounting machine of the disclosure, the control device can control the head so as to mount the component under a predetermined mounting condition in a case where the control device determines that the suction posture of the component is good because the suction angle is a normal angle and control the head so as to mount the component under a mounting condition obtained by changing the predetermined mounting condition so as to reduce the influence due to the inclination of the component in a case where the control device determines that the suction posture of the component is inclined because the suction angle is not a normal angle. In this way, in a case where the suction angle of the component is not normal (in case where suction angle of component is within predetermined allowable range while not normal), generation of the mounting defect of the component can be reduced.

In addition, in the component mounting machine of the disclosure, the control device can control a moving mechanism so that the head moves until the suction nozzle sucking the component is positioned at an upper position of the mounting position of the component, control the imaging device so as to image the component from the side when the suction nozzle is in the upper position, and control the head so as to lower the suction nozzle from the upper position to the mounting position to mount the component. In this way, after the movement in the horizontal direction is completed, it is possible to detect the suction angle of the component at an appropriate timing before mounting the component.

In addition, in the component mounting machine of the disclosure, the control device can control the imaging device so as to image the suction nozzle in advance in a state where the component is not sucked, detect an angle of a suction surface in which the suction nozzle sucks the component in advance based on the image obtained by the imaging, and determine the suction posture of the component based on a relative angle between the suction angle and an angle of the suction surface when the suction angle of the component is detected. In this way, it is possible to appropriately detect the suction angle of the component from which the influence of the inclination of the suction nozzle is excluded.

DESCRIPTION OF EMBODIMENTS

Figure 1:
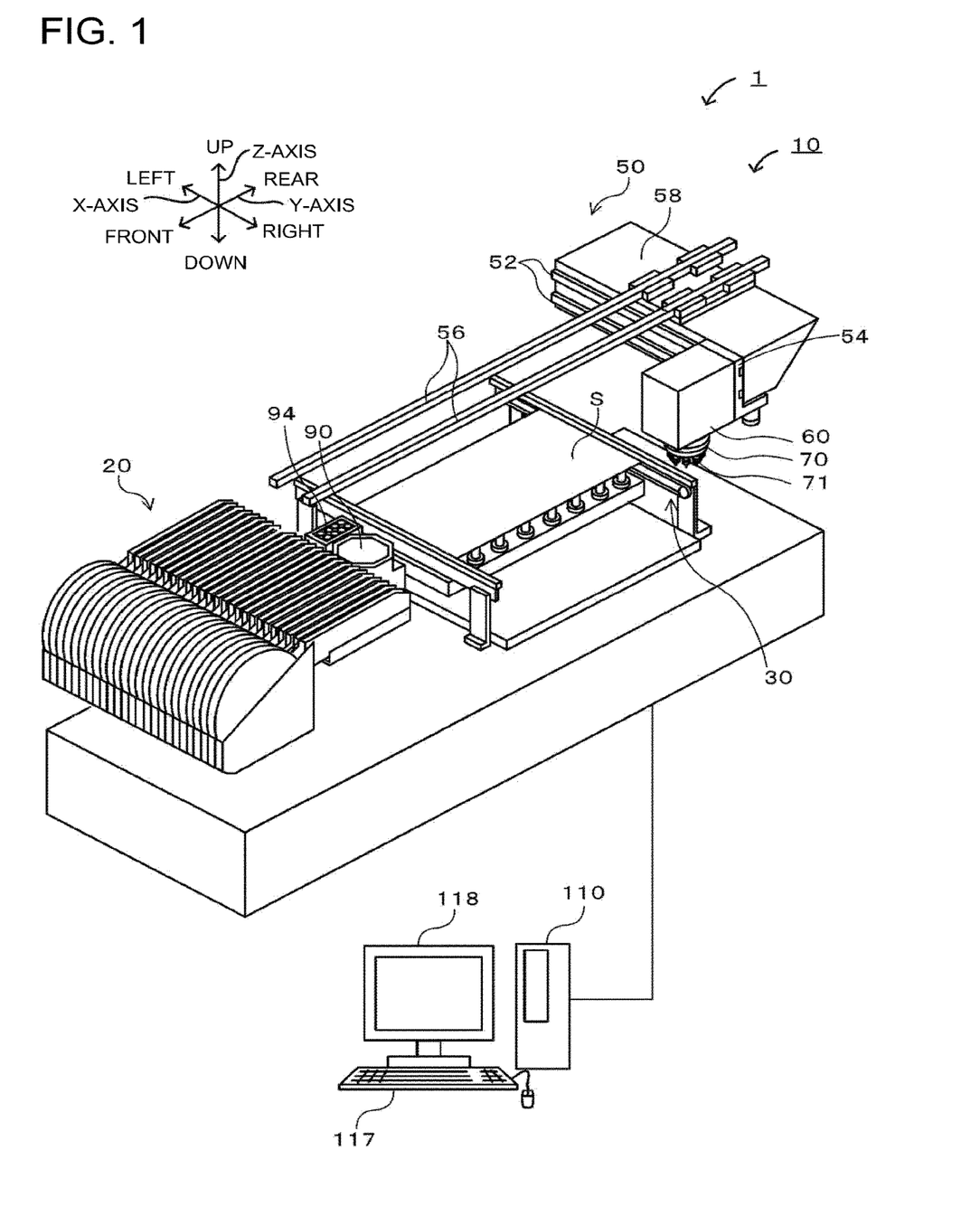
FIG. 1 is a configuration view illustrating an outline of a configuration of a component mounting system 1.
Figure 2:
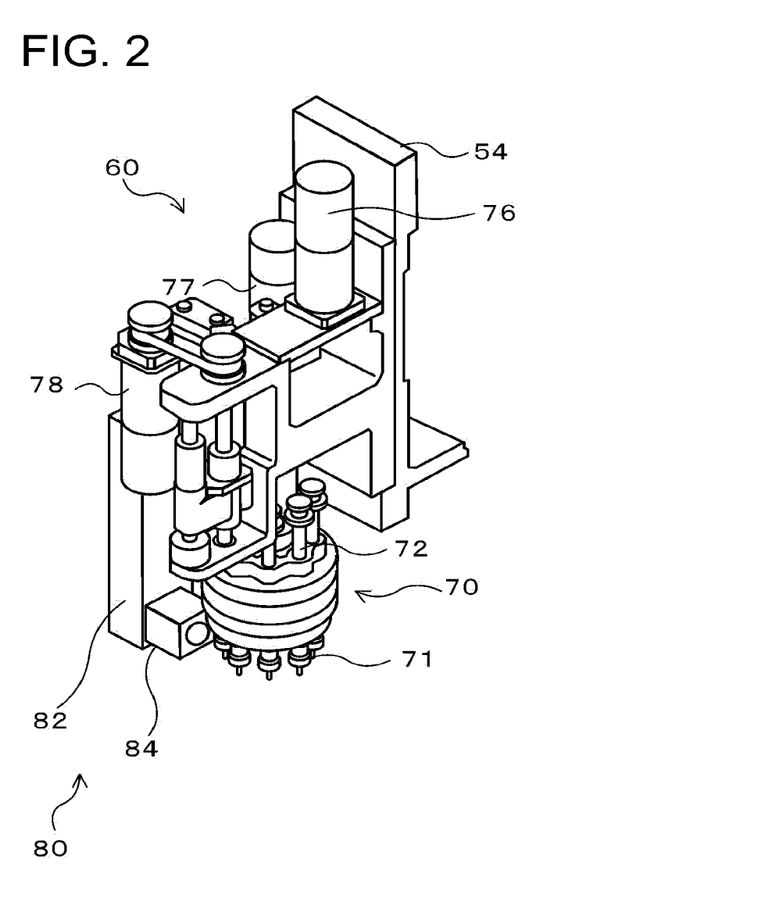
FIG. 2 is a configuration view illustrating an outline of a configuration of a head unit 60.
Figure 3:
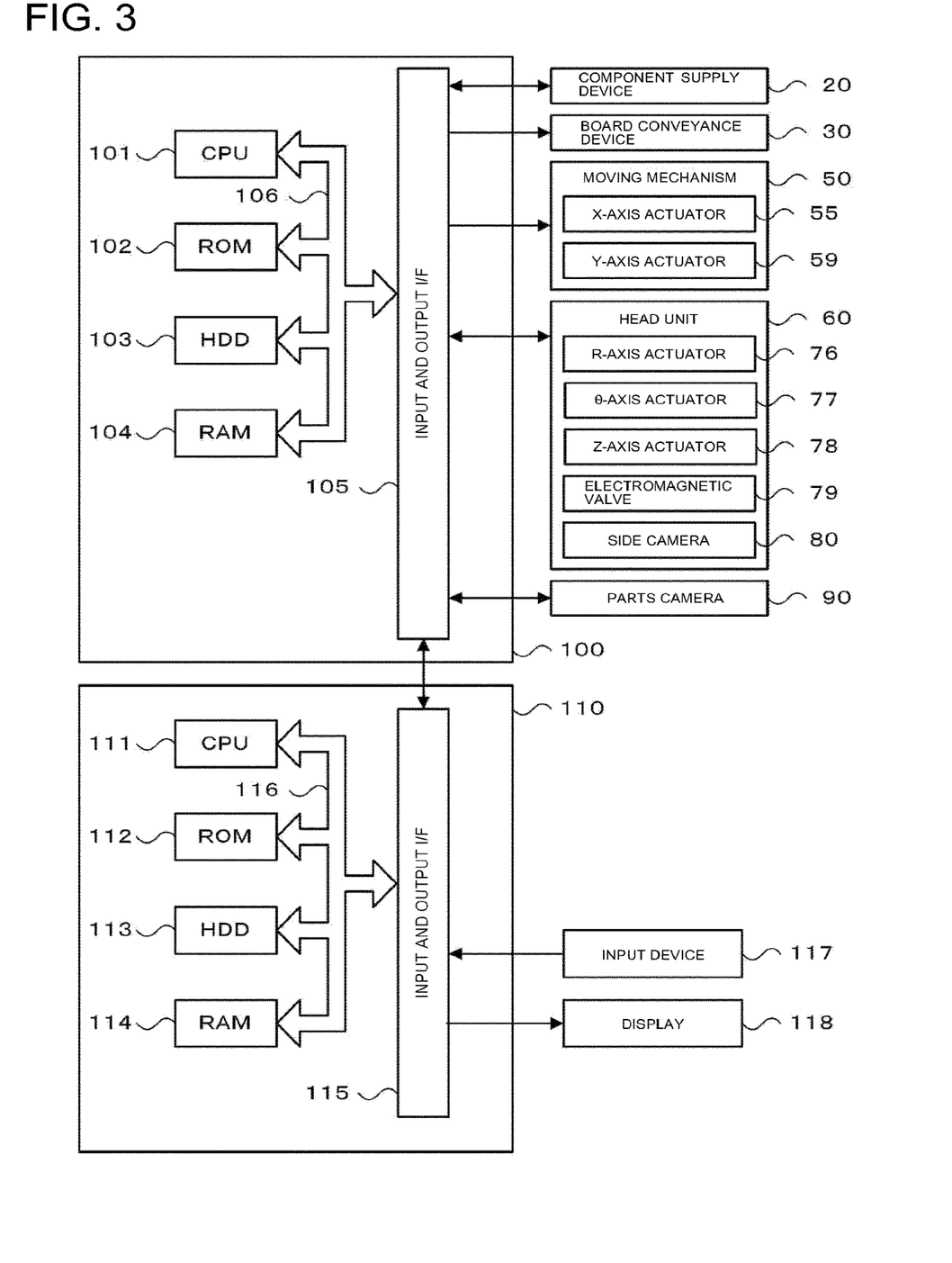
FIG. 3 is a configuration view illustrating an outline of the configuration of a control device 100 and a management device 110.

Next, embodiments of the disclosure will be described with reference to the drawings. FIG. 1 is a configuration view illustrating an outline of a configuration of a component mounting system 1, FIG. 2 is a configuration view illustrating an outline of a configuration of a head unit 60 and FIG. 3 is a configuration view illustrating an outline of the configuration of a control device 100 and a management device 110. The component mounting system 1 includes a component mounting machine 10 that mounts a component P on a board S on which an adhesive or the like is applied to amounting position and a management device 110 that manages the entire system. In this embodiment, a left-right direction in FIG. 1 is the X-axis direction, a front-rear direction is the Y-axis direction, and an up-down direction is the Z-axis direction.

As illustrated in FIG. 1, the component mounting machine 10 includes a component supply device 20 that includes a reel or the like that houses a component P, aboard conveyance device 30 that conveys the board S, a head unit 60 that sucks the component P by a suction nozzle 71 to mount the component on the board S, a moving mechanism 50 that moves the head unit 60, and a control device 100 (see FIG. 3) which controls the entire mounting machine. In addition, in addition to these components, the component mounting machine 10 further includes a parts camera 90 which images components P sucked by the suction nozzle 71 from below, and a nozzle stocker 94 which stocks multiple types of suction nozzles 71. The suction nozzle 71 of the head unit 60 is exchanged as appropriate according to the type and size of the component P.

The moving mechanism 50 includes a guide rail 56 which is provided along the Y-axis direction on the upper portion of the device, a Y-axis slider 58 which can move along the guide rail 56, and a guide rail 52 which is provided on the front face of the Y-axis slider 58 in the X-axis direction, and an X-axis slider 54 which can move along the guide rail 52 and to which the head unit 60 is attached. The X-axis slider 54 is moved by driving an X-axis actuator 55 (see FIG. 3) and the Y-axis slider 58 is moved by driving a Y-axis actuator 59 (see FIG. 3). By controlling drive of the moving mechanism 50 (X-axis actuator 55 and Y-axis actuator 59), the control device 100 can move the head unit 60 to an arbitrary position on an XY-plane.

As illustrated in FIG. 2, the head unit 60 includes a rotary head 70 in which multiple shaft-like suction nozzles 71 are arranged at predetermined angular intervals in a circumferential direction (on circumference coaxial with rotation axis), and a side camera 80 which images the suction nozzle 71 from the side. In the rotary head 70, for example, 12 suction nozzles 71 are arranged at intervals of 30 degrees.

The rotary head 70 includes multiple nozzle holders 72 which respectively hold multiple suction nozzles 71, an R-axis actuator 76 which intermittently rotates the rotary head 70 by a predetermined angle, a θ-axis actuator 77 which rotates each suction nozzle 71, and a Z-axis actuator 78 which moves the suction nozzle 71 in the Z-axis (up and down) direction. When the rotary head 70 rotates intermittently, each suction nozzles 71 moves by a predetermined angle at each angular position on the circumference. In addition, the suction nozzle 71 (suction port) communicates with and blocks a suction pump (not illustrated) by an electromagnetic valve 79 (see FIG. 3), and a negative pressure from the suction pump acts to be capable of sucking the component P.

The side camera 80 is configured of a camera main body 82 that is attached to a lower section of the head unit 60 and an optical system unit 84 which forms a light path to the camera main body 82. The optical system unit 84 includes an irradiation section (not illustrated) and irradiates ultraviolet light from the irradiation section toward a cylindrical fluorescent member (not illustrated) attached to the center position of the lower section of the rotary head 70. When a fluorescent member emits light by receiving the ultraviolet light, light excluding the light shielded by the suction nozzle 71 and the component P at a predetermined imaging position enters the optical system unit 84 and is guided to the camera main body 82 via the light path of the optical system unit 84. Accordingly, the camera main body 82 can image the suction nozzle 71 and the component P at a predetermined imaging position. The predetermined imaging position is, for example, a position (suction position, mounting position, or the like.) at which the suction nozzle 71 moves in the Z-axis direction by the Z-axis actuator 78 of the respective positions on the circumference. Based on the image captured by the side camera 80, the control device 100 determines the presence or absence of the component P, the suction posture of the component P, and the like.

As illustrated in FIG. 3, the control device 100 is configured as a microprocessor mainly including the CPU 101 and includes a ROM 102, an HDD 103, a RAM 104, and an input and output interface 105 in addition to the CPU 101. These are connected via a bus 106. The control device 100 inputs image signals from the side camera 80 and the parts camera 90 via the input and output interface 105. In addition, the control device 100 outputs the drive signals or the like to the component supply device 20, the board conveyance device 30, the moving mechanism 50 (X-axis actuator 55, the Y-axis actuator 59), a head unit 60 (R-axis actuator 76, θ-axis actuator 77, Z-axis actuator 78, electromagnetic valve 79) via the input and output interface 105.

The management device 110 is a general-purpose computer, for example, and includes a CPU 111, a ROM 112, an HDD 113, a RAM 114, and an input and output interface 115, as illustrated in FIG. 3. These are connected via a bus 116. The management device 110 inputs input signals from an input device 117 such as a mouse and a keyboard via the input and output interface 115. In addition, the management device 110 outputs an image signal to the display 118 via the input and output interface 115. The HDD 113 stores a production program of the board S and the like. The production program for the board S is a program for defining which component P is to be mounted on the board S in which order in the component mounting machine 10 and, in addition, how many boards S on which the component P is mounted are to be produced. The management device 110 outputs a command signal to the control device 100 so that the component P is mounted at a predetermined mounting position in a predetermined mounting direction according to the production program.

Figure 4:
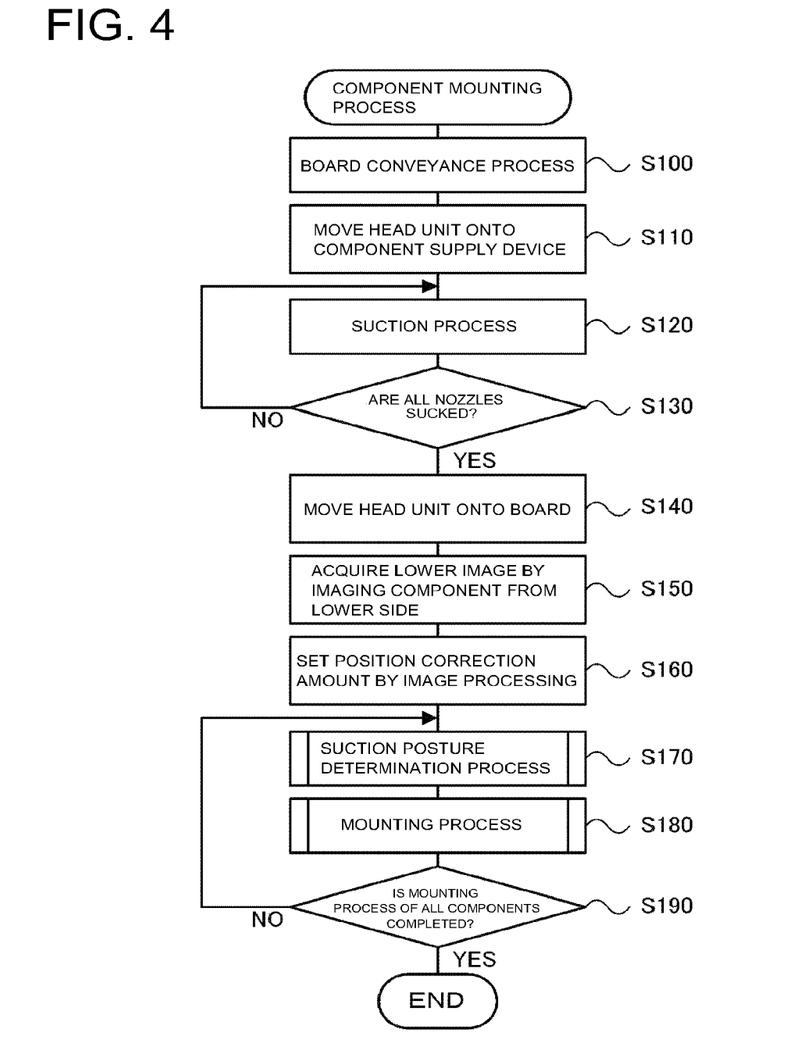
FIG. 4 is a flowchart illustrating an example of a component mounting process.

The following is a description of the operation of the component mounting machine 10 configured as described above. FIG. 4 is a flowchart illustrating an example of a component mounting process executed by the CPU 101 of the control device 100.

In the component mounting process, first, the CPU 101 of the control device 100 performs a board conveyance process of controlling a board conveyance device 30 to convey the board S (S100). Next, the CPU 101 controls the moving mechanism 50 (X-axis actuator 55 and Y-axis actuator 59) to move the head unit 60 onto a supply position of the component supply device 20 (S110). Subsequently, the CPU 101 controls the rotary head 70 to perform a suction process of causing the suction nozzle 71 to suck the component P (S120). The process of S120 is performed by the R-axis actuator 76 being controlled so that the suction nozzle 71 moves to the suction position on the circumference, the Z-axis actuator 78 being controlled so that the suction nozzle 71 is lowered until the suction surface (tip) of the suction nozzle 71 moved to the suction position abuts against the components P, and the electromagnetic valve 79 being controlled so that a negative pressure acts on the suction nozzle 71. When the suction process is performed, the CPU 101 determines whether or not all the suction nozzles 71 suck the component P (S130), when the CPU 101 determines that there is the suction nozzle 71 that does not suck the component P, the process returns to the process of S120, and when the CPU 101 determines that all the suction nozzles 71 suck the component P, the process proceeds to the next step S140.

Next, the CPU 101 controls the moving mechanism 50 to move the head unit 60 onto the board S via the upper side of the parts camera 90 (S140). In addition, when the head unit 60 moves above the parts camera 90, the CPU 101 controls the parts camera 90 to image each component P sucked by each suction nozzle 71 from the lower side to acquire a lower image (S150) and processes the acquired lower image to set a position correction amount at the time of mounting (S160). The processing of S160 is performed by processing the lower image to detect a deviation of the suction position of the component P with respect to the suction nozzle 71 and setting a position correction amount that can eliminate the positional deviation for each component P. In addition to the deviation of the suction position of the component P, the CPU 101 can detect the shape, size, orientation, or the like of the component P.

Subsequently, the CPU 101 performs a suction posture determination process of determining the suction posture of the component P sucked by the suction nozzle 71 (S170) and then performs a mounting process of mounting the component P on the board S (S180). The process of S170 is performed by the R-axis actuator 76 being driven so that the suction nozzle 71 sucking the next component P to be mounted moves to the mounting position, and the θ-axis actuator 77 being driven so that the suction nozzle 71 (component P) rotates until the predetermined side face of the component P is oriented to be imaged by the side camera 80. In other words, in S170, the suction posture of the component P sucked by the suction nozzle 71 immediately before mounting is determined. When the mounting process of S180 is performed, the CPU 101 determines whether or not the mounting process of all the components P sucked by each suction nozzle 71 is performed (S190), when the CPU 101 determines that the mounting process of all the components P is not performed, the processes of S170 and S180 are repeated, and when the CPU 101 determines that the mounting processing of all the components P is performed, the component mounting process is completed.

Figure 5:
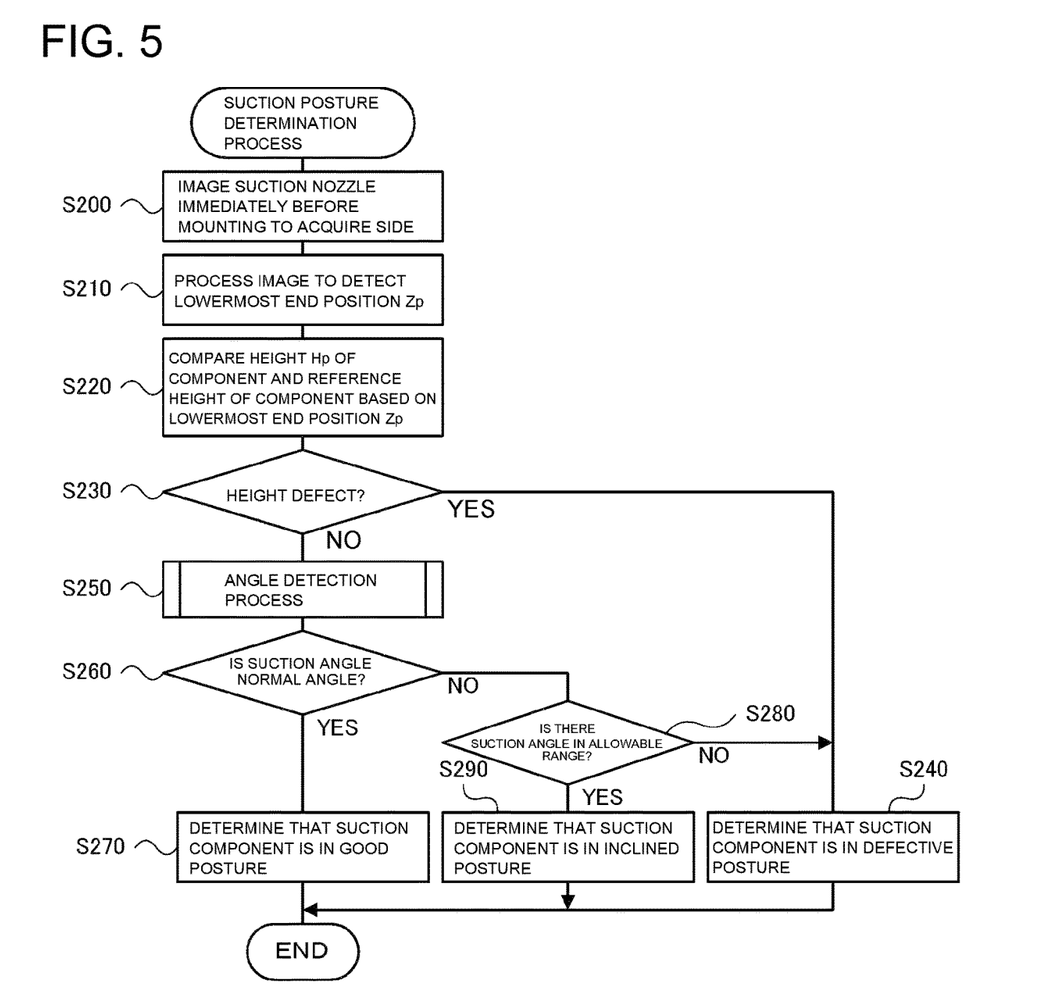
FIG. 5 is a flowchart illustrating an example of a suction posture determination process.

FIG. 5 is a flowchart illustrating an example of a suction posture determination process in S170. First, the CPU 101 controls the side camera 80 to image the suction nozzle 71 immediately before mounting at the mounting position from the side to acquire a side image (S200), processes the obtained side image to detect the lowermost end position Zp of the component P (S210). The process of S210 detects the lowermost end position Zp by edge pixels at the lower edge of the area of the component P determined from the side image being extracted, and a position in the Z-direction of each edge pixels specifying a position of the smallest pixel (pixel at the lowermost position). Even if the component P having a rectangular shape in a side view, for example, is sucked to the suction nozzle 71 in a horizontal state, due to slight irregularities on the lower face of the component P, errors in the image processing, and the like, if there is a slight difference in each position of the edge pixels on the lower edge of the component P, it is possible to determine the lowermost position. In addition, if there are multiple positions that can be the lowermost ends, the CPU 101 may detect the position closest to the center of the component P as the lowermost end position Zp.

Next, the CPU 101 compares the height Hp (detection height Hp) of the component P detected based on the lowermost end position Zp with the reference height of the component P (S220) to determine whether or not there is the height defect of the component P (S230). Here, if the position of the suction surface of the suction nozzle 71 in the side image is determined in advance, the process of S220 is a process of detecting the height Hp by calculating the difference between the lowermost end position Zp and the position of the suction surface of the suction nozzle 71. Alternatively, the CPU 101 may detect the uppermost end position of the component P from the side image and calculate the difference between the uppermost end position and the lowermost end position Zp, and thus detects the height Hp. In addition, the process of S230 is performed by determining that there is no height defect if the height Hp of the component P is within the reference range and determining that there is a height defect if the height Hp is outside the reference range. The reference range may be a range having a slight margin with respect to the reference height of the component P, or the like. In addition, the CPU 101 may determine whether or not there is a height defect based on whether or not the lowermost end position Zp is within the range of the reference position determined for each of the components P. The height Hp is out of the reference range in a case where the component P is raised from a normal orientation or in a case where the component P is inclined largely diagonally from a normal orientation and thus the CPU 101 determines that there is a height defect. If the CPU 101 determines that there is a height defect in S230, the CPU 101 determines that the component P sucked by the suction nozzle 71 is in a defective posture (S240) and completes the suction posture determination process. On the other hand, if the CPU 101 determines that there is no height defect in S230, the CPU 101 executes an angle detection process of detecting the suction angle of the component P (S250).

Figure 6:
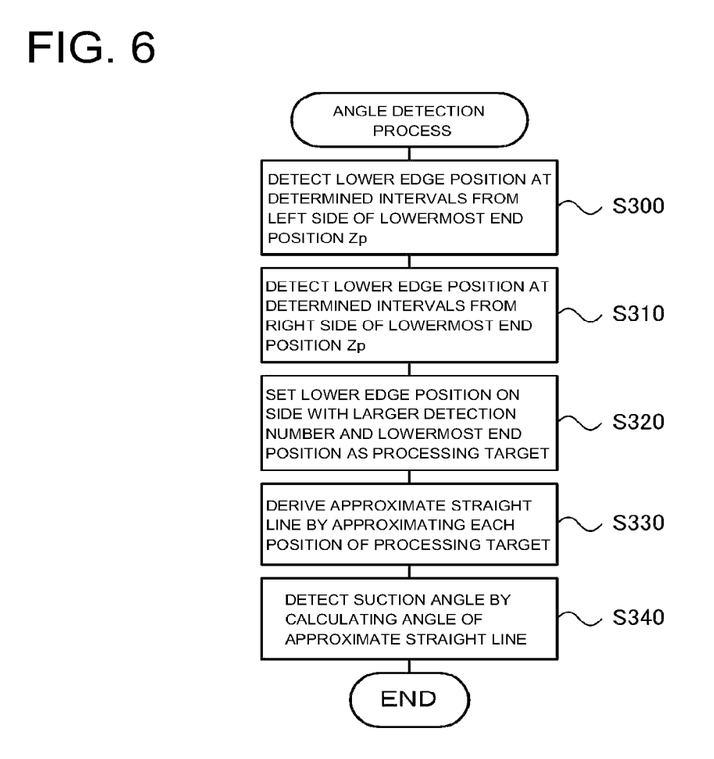
FIG. 6 is a flowchart illustrating an example of an angle detection process.
Figure 7:
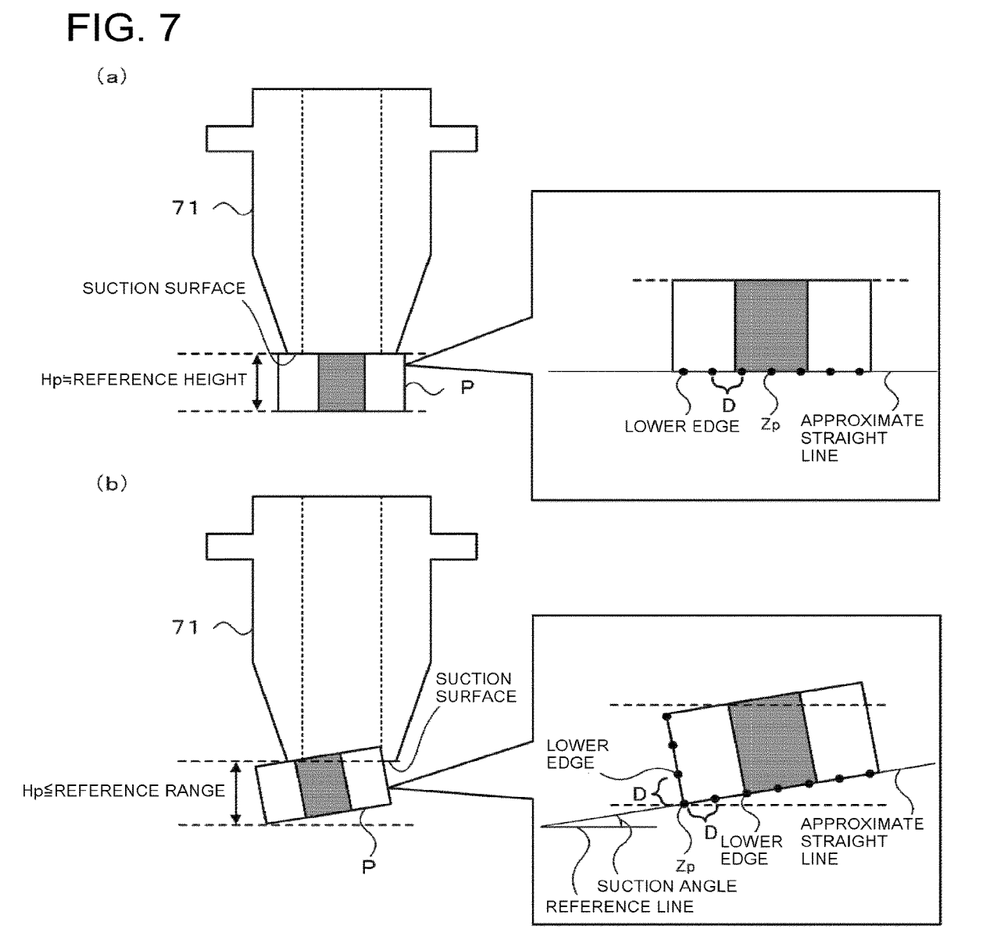
FIG. 7 is an explanatory view illustrating an example of a state of a component P sucked by a suction nozzle 71.

FIG. 6 is a flowchart illustrating an example of an angle detection process and FIG. 7 is an explanatory view illustrating an example of a state of a component P sucked by a suction nozzle 71. FIG. 7(a) illustrates a state where the component P is sucked in a normal posture without inclination or the like, and FIG. 7(b) illustrates a state where the component P is sucked in an obliquely inclined posture. FIG. 7 exemplifies a component having a lower side having a length exceeding the reference height as the component P and having a rectangular shape in a side view. In FIG. 7(a), the approximate center position of the component P is detected as the lowermost end position Zp and in FIG. 7(b), the position of the lower left corner of the component P is detected as the lowermost end position Zp. Here, the suction nozzle 71 having a size matching the size of the component P is used. However, in recent years, the miniaturization of the component P has progressed remarkably, and when the component P is sucked by the suction nozzle 71, due to a positional deviation of the component P or the like, there is a case where a portion of the component P enters the suction port of the suction nozzle 71 (See FIG. 7(b)). In that case, although the component P is sucked in a state of being obliquely inclined, since a portion of the component P entering the suction nozzle 71 does not appear in the side image, the height Hp detected by the image processing may not be significantly different from the reference height of the component P in a some cases. Therefore, the CPU 101 erroneously determines that the height Hp is within the reference range. On the other hand, if the reference range is narrowed, it is possible for the CPU 101 to detect the height defect of the component P as illustrated in FIG. 7(b). However, in such a case, variation in the height Hp due to manufacturing errors or the like may be frequently detected as a height defect, which is not preferable. Therefore, in this embodiment, the CPU 101 performs a determination of the height defect of the component P in the reference range of the related art and detects the suction angle for the component P that is determined not to have a height defect and thus the suction posture of the component P can be correctly determined as illustrated in FIG. 7(b).

In the angle detection process of FIG. 6, the CPU 101 first detects the lower edge position of the component P at a predetermined interval D from the left side using the lowermost end position Zp (S300) as a reference, and detects the lower edge position of the component P from the right side using the lowermost end position Zp as a reference at the predetermined interval D (S310). In S300 and S310, the CPU 101 detects the lower edge position by sequentially extracting the pixel at a position separated by the number of pixels corresponding to the predetermined interval D using the pixel position of the lowermost end position Zp of the multiple edge pixels as a reference at the lower edge on the left side and the lower edge on the right side of the lowermost end position Zp. In addition, in a case where the number of detections of the lower edge position is equal to or larger than a predetermined number (for example, multiple numbers which are two or more such as six points) or in a case where the lower edge position is not detected at a position separated from the lower edge position previously detected by a predetermined interval D, the CPU 101 completes the detection of the lower edge position. In FIG. 7(a), multiple (the same number) of lower edge positions (indicated by black circles) are detected from the left side and the right side on the bottom side of the component P with the lowermost end position Zp being interposed therebetween. In addition, in FIG. 7(b), multiple lower edge positions (indicated by black circles) are detected from the left side (the side of the side face) and the right side (the side of the bottom face) with the lowermost end position Zp being interposed therebetween.

Next, the CPU 101 sets the lower edge position and the lowermost end position Zp on the side having the larger detection number among the left side and the right side of the lowermost end position Zp as a processing target (S320) and approximates each position of the set processing target with a straight line and derives an approximate straight line (S330). In FIG. 7(b), three lower edge positions are detected from the left side of the lowermost end position Zp, six lower edge positions from the right side of the lowermost end position Zp are detected, and thus a side having the larger number of detections is the right side. Therefore, the CPU 101 sets the lowermost end position Zp and the six lower edge positions on the right side than the lowermost end position Zp as a processing target. Accordingly, it is possible to prevent each position on the side of the side face of the component P from being erroneously a processing target when detecting the suction angle of the component P having the lower side having a length exceeding the height. On the other hand, in FIG. 7(a), the same number of lower edge positions is detected on the left side and the right side of the lowermost end position Zp. In a case where the numbers of detections on the left and right are the same, the CPU 101 may set the lower edge position on the predetermined one side as a processing target. In addition, the process of S330 is performed by deriving an approximate straight line using the least-square method, for example. Of course, CPU 101 may use any method may be used as long as the approximate straight line can be derived without limiting to the least-square method. When the approximate straight line is derived, the CPU 101 detects the suction angle of the component P by calculating an angle formed by the approximate straight line with a reference line (for example, line orthogonal to Z-axis, horizontal line) (S340) and the angle detection process is completed.

When the suction angle of the component P is detected in this way, the CPU 101 determines whether or not the suction angle of the component P is a normal angle in the suction posture determination process of FIG. 5 (S260). Here, the normal angle can be an angle in a case where the component P is normally sucked to the suction nozzle 71 without inclining (for example, FIG. 7(*a*)) and can be an angle at which the approximate straight line is substantially orthogonal to the Z-axis (suction angle is about 0 degrees), or the like. If the CPU 101 determines that the suction angle of the component P is the normal angle in S260, the CPU 101 determines that the suction posture of the component P is good (S270) and completes the suction posture determination process. On the other hand, when the CPU 101 determines that the suction angle is not a normal angle, the CPU 101 determines whether or not the suction angle is within a predetermined allowable range (S280), when determining that the suction angle is within the predetermined allowable range, the CPU 101 determines that the suction posture of the component P is a posture (which is referred to as posture with which mounting is allowed, inclined posture) in which although the suction posture of the component P is inclined, the component can be mounted on the board S (S290) and thus completes the suction posture determination process. In addition, if the CPU 101 determines that the suction angle is not in the allowable range and is outside the allowable range, the CPU 101 determines that the inclination of the component P is large and the posture is poor (S240) and completes the suction posture determination process. Here, the predetermined allowable range can be determined as a range of several degrees or ten or more degrees on the positive side and the negative side with respect to the normal angle (here, approximately 0 degrees).

Figure 8:
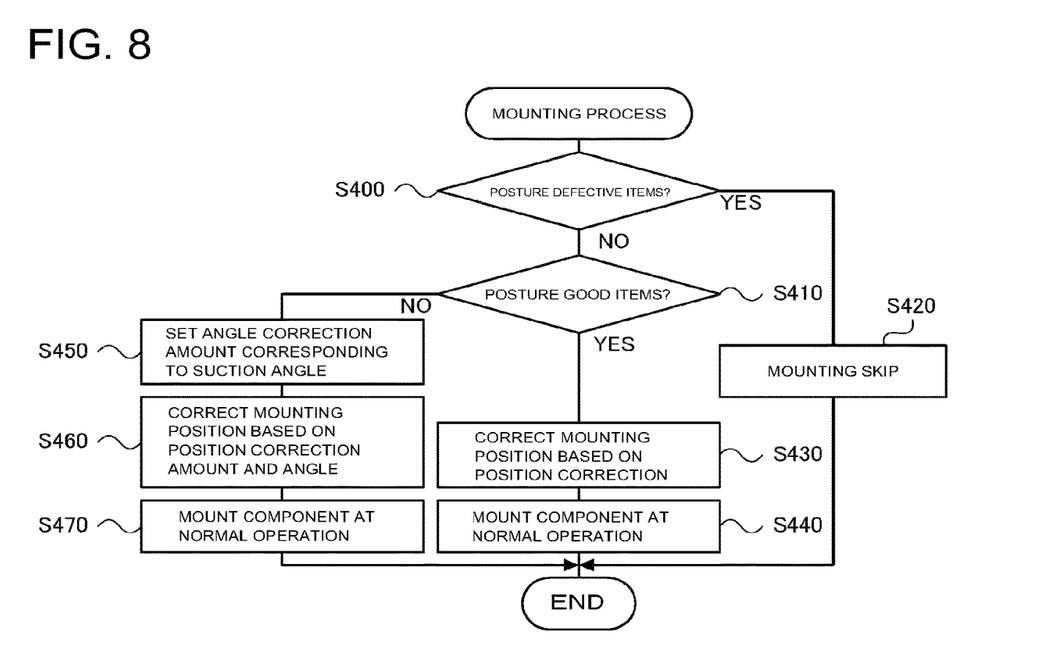
FIG. 8 is a flowchart illustrating an example of amounting process.

FIG. 8 is a flowchart illustrating an example of the mounting process of S180. First, the CPU 101 determines whether or not the component P to be subjected to the mounting process is a posture defective item determined as a defective posture in a suction posture determination process (S400) and whether or not the component P is a posture good item determined as a good posture in the suction posture determination process (S410), respectively. If the CPU 101 determines that the component P is a defective posture in S400, the CPU 101 skips the mounting of the component P (S420) and completes the mounting process. As described above, since the CPU 101 does not mount the component P determined as a defective posture due to the height defect, or the component P determined as the defective posture since the suction angle exceeds the predetermined allowable range even if the height is not defective, it is possible to reduce mounting defect of the component P. The CPU 101 performs a process of discarding the components P whose mounting is skipped in a predetermined discard area or transmits information indicating that the mounting of the component P is skipped to the management device 110.

In addition, when the CPU 101 determines that the component P is not a posture defective item but a posture good item in S400 and S410, the CPU 101 corrects a predetermined mounting position of the component P based on the position correction amount set in S160 of the component mounting process of FIG. 4 (S430), mounts the component P on the mounting position after correction in a normal operation (S440), and completes the mounting process. In the process of S440, first, the moving mechanism 50 is controlled so that the suction nozzle 71 sucking the component P to be mounted moves to a position on the mounting position after correction, and a process of controlling the θ-axis actuator 77 so that the suction nozzle 71 rotates is performed until the component P reaches a predetermined mounting direction. Subsequently, in the process of S440, since the Z-axis actuator 78 is controlled so that the suction nozzle 71 is lowered at a normal lowering speed until the component P is placed on the board S, the electromagnetic valve 79 is controlled and a process of releasing suction of the component P by applying a positive pressure to the suction nozzle 71 is performed.

On the other hand, if the CPU 101 determines that the component P is not a posture defective item or a posture good item but an inclined posture component in S400 and S410, the CPU 101 sets an angle correction amount according to the suction angle of the component P (S450). Here, since the component P in the inclined posture comes into contact with the board S from the bottom face corner (the lowermost end position Zp) when mounted, the component P moves so as to slide on the board S and the mounting position deviates. It can be said that the positional deviation amount (sliding amount) and a deviation direction of such a component P tend to differ depending on the type (shape, size, weight) and suction angle of the component P, the kind of adhesive applied to the board S. Therefore, the operator (worker) or the like of the component mounting machine 10 obtains in advance the tendency of the positional deviation amount and the direction thereof according to the type and suction angle or the like of the component P by experiment, simulation, experience, or the like and can store the tendency in the HDD 103 or the like. In this way, the process in S450 can perform by setting the correction amount assuming the deviation when the component P in the inclined posture is placed on the board S as an angle correction amount, based on the positional deviation amount and the deviation direction stored in the HDD 103.

Subsequently, the CPU 101 corrects the predetermined mounting position of the component P based on the angle correction amount set in S450 and the position correction amount set in S160 of the component mounting process in FIG. 4 (S460), mounts the component on the mounting position after the correction at low-speed operation (S470), and completes the mounting process. In the process of S460, as described above, since the mounting position is corrected by using the angle correction amount assuming the deviation when the component P in the inclined posture is placed on the board S, when the component P is mounted even if positional deviation (slippage) due to the inclination posture is generated, the component P can be mounted at an appropriate position. In addition, mounting of the low-speed operation of S470 is performed by controlling the Z-axis actuator 78 so that the suction nozzle 71 is lowered at a lower speed than the normal operation of S440. Here, since the component P in the inclined posture comes into contact with the board S from the bottom face corner (lowermost end position Zp) when mounted, when the component P is lowered at a normal speed, depending on the momentum, the component P may be repelled by the board S and move in an unexpected direction. Therefore, in S470, the CPU 101 lowers the suction nozzle 71 at a low-speed to reduce the momentum when the component P comes into contact with the board S, and thus movement of the component P in an unexpected direction is prevented. In this manner, in a case where the component P is in the inclined posture, since the CPU 101 performs mounting at a lower speed than usual while correcting the mounting position with the angle correction amount corresponding to the suction angle, the CPU 101 appropriately corresponds to the inclination of the component P and thus generation of a corresponding mounting defect can be prevented. Since the component P is mounted in a low-speed operation in a case where the component P is in the inclined posture, even when obtaining the tendency of the positional deviation amount and the direction thereof according to the inclination of the component Pas described above, experiments and simulations may be performed at low-speed operation.

Here, the correspondence relationship between the constituent elements of this embodiment and the constituent elements of the disclosure will be clarified. The component mounting machine 10 of this embodiment corresponds to the component mounting machine of the disclosure, the suction nozzle 71 corresponds to a suction nozzle, the head unit 60 corresponds to a head, the side camera 80 corresponds to an imaging device, The control device 100 that executes the processes of S170 and S180 in the component mounting process of FIG. 4 (suction posture determination process of FIG. 5, angle detection process of FIG. 6, mounting process of FIG. 8) corresponds to the control device.

The component mounting machine 10 of this embodiment described above detects the lowermost end position Zp of the component P and multiple lower edge positions from the side image obtained by imaging the component P sucked by the suction nozzle 71 by the side camera 80 and detects the suction angle of the component P based on the lowermost end position Zp and the multiple lower edge positions to determine the suction posture of the component P. Therefore, since the component mounting machine 10 can appropriately detect the suction angle of the component P based on at least three points of the lowermost end position Zp and the multiple lower edge positions, it is possible to correctly determine the suction posture of the component P.

In addition, since the component mounting machine 10 detects the suction angle with respect to the component P determined that the height Hp of the component P is within the reference range, although the height Hp is within the reference range, actually in a state where the component P is inclined (a state where a portion of component P is entering the suction port of the suction nozzle 71, or the like) can be correctly detected. In addition, since the component mounting machine 10 detects the angle of the approximate straight line by approximating the lowermost end position Zp and the multiple lower edge positions by a straight line as the suction angle, it is possible to accurately detect the suction angle by a simple method. In addition, since the component mounting machine 10 detects the lower edge position from the left and right of the lowermost end position Zp at predetermined intervals D and uses the lower edge position on the side where the detection number is large, it is possible to prevent the erroneous detection of the suction angle of the component P having the lower side having a length exceeding the reference height. In other words, in a rectangular component having a short side in the height direction and a long side in the lateral direction in a side view, in a case where a corner portion is detected as the lowermost end position, it is possible to detect the suction angle by correctly detecting the lower edge position on the long side among the short side and the long side interposing the corner portion. In addition, in a case where it is determined that the suction angle exceeds the predetermined allowable range, the component mounting machine 10 can prevent mounting defect since the component P is not mounted on the board S. In addition, since the component mounting machine 10 mounts the component P in the inclined posture under the mounting condition using the position correction amount (angle correction amount) corresponding to the angle with different lowering speed with respect to the normal mounting condition (predetermined mounting condition), it is possible to accurately mount the component P in accordance with the suction angle of the component P appropriately. In addition, since the component mounting machine 10 detects the suction angle based on the side image immediately before mounting the component P, it is possible to determine the suction posture at an appropriate timing.

It is to be understood that the disclosure is not limited to the embodiment described above at all and can be implemented in various modes as long as it falls within the technical scope of the disclosure.

In the embodiment described above, the CPU 101 of the control device 100 determines whether or not the component P is mounted based on whether or not the suction angle of the component P is within a predetermined allowable range, and in a case where the CPU 101 determines that the component P is to be mounted, although the component P is mounted under different mounting conditions based on whether or not the suction angle is a normal angle, the disclosure is not limited thereto. For example, in a case where the CPU 101 determines that the component P is mounted since the suction angle of the component P is within the predetermined allowable range, regardless of whether or not the suction angle is a normal angle, the CPU 101 may mount the component P under same mounting conditions. In addition, the CPU 101 may determine whether or not the component P is mounted based on whether or not the suction angle of the component P is a normal angle, if the suction angle is a normal angle, the CPU 101 may determine to mount the component P, and if the suction angle is not a normal angle, the CPU 101 may determine that the component P is not mounted. In addition, if the suction angle is not the normal angle, the CPU 101 transmits the suction angle to the management device 110, the management device 110 displays the suction angle on the display 118, or the like, and the CPU 101 may determine whether or not the component P is mounted by seeking determination of the operator. In addition, the management device 110 can aggregate the suction angle of the component P for each type of the component or for each type of the suction nozzle 71, and the operator may use aggregate result thereof for improving the suction posture of the component P or the like.

Figure 9:
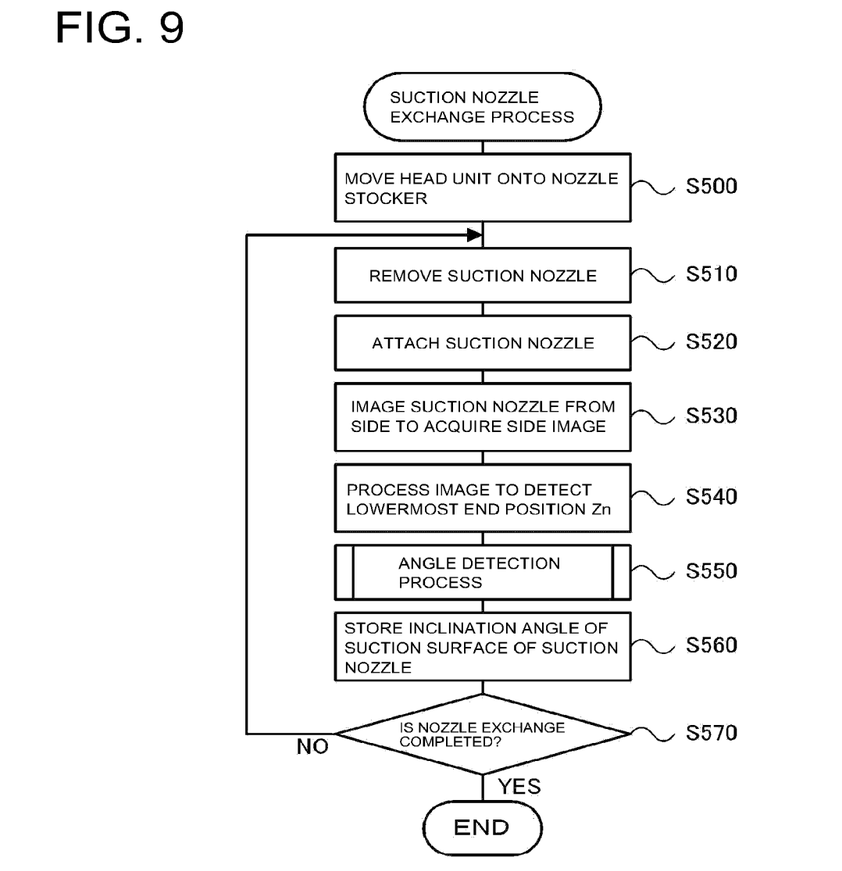
FIG. 9 is a flowchart illustrating an example of a suction nozzle exchange process.

In the embodiment described above, although the CPU 101 does not consider the inclination angle of the suction surface (end surface of suction port) of the suction nozzle 71 when detecting the suction angle of the component P, the disclosure is not limited thereto and the inclination angle of the suction surface of the suction nozzle 71 may be taken into consideration. FIG. 9 is a flowchart illustrating an example of a suction nozzle exchange process. In the suction nozzle exchange process, first, the CPU 101 of the control device 100 causes the head unit 60 to move by controlling the moving mechanism 50 so that the suction nozzle 71 to be exchanged is positioned on the nozzle stocker 94 (S500). Then, since the CPU 101 accommodates and removes the suction nozzle 71 to be exchanged in the empty area in the nozzle stocker 94 (S510), another suction nozzle 71 in the nozzle stocker 94 is mounted on the nozzle holder 72

(S520). Next, the CPU 101 images the attached suction nozzle 71 with the side camera 80 to acquire a side image (S530), processes the acquired side image to detect the lowermost end position Zn of the suction nozzle 71 (S540) and executes the angle detection process of detecting the inclination angle of the suction surface of the suction nozzle 71 based on the lowermost end position Zn (S550).

Here, the process of S540 is performed in the same manner as S210 of the suction posture determination process of FIG. 5 and the process of S550 is performed in the same manner as S250 of the suction posture determination process (angle detection process of FIG. 6). In other words, the CPU 101 derives an approximate straight line that approximates the lowermost end position Zn and the lower edge position where the detection number is large among the left side or the right side of the lowermost end position Zn and the angle of the approximate straight line is detected as an inclination angle of the suction surface of the suction nozzle 71. In general, although the suction surface of the suction nozzle 71 is horizontal (angle is almost 0 degrees), the suction surface may be inclined due to processing defect, attachment defect or the like. The CPU 101 detects such an inclination angle, stores the detected inclination angle in the RAM 104 (S560), and determines whether or not the exchange of the suction nozzle 71 is completed (S570). When the CPU 101 determines that exchange of the suction nozzle 71 is not completed, the process returns to S510 and repeats the process and when the CPU 101 determines that exchange of the suction nozzle 71 is completed, the suction nozzle exchange process is completed.

As described above, in the alternative embodiment, the inclination angle of the suction surface of the suction nozzle 71 is detected and stored when the suction nozzle 71 is exchanged (when suction nozzle 71 is newly attached to nozzle holder 72). Therefore, for example, when the suction angle of the component P is detected by the angle detection process of the component P in FIG. 6, by decreasing the inclination angle of the suction surface of the suction nozzle 71 from the suction angle, It is possible to detect the inclination of the component P itself by eliminating the influence of the suction nozzle 71. In other words, it is possible to distinguish and detect whether the component P is inclined since the suction surface of the suction nozzle 71 is inclined or whether the suction surface of the suction nozzle 71 is horizontal but the component P is inclined. Therefore, since it is possible to correctly determine the suction angle of the component P, it can be used for improving the suction posture of the component P or the like.

In the embodiment described above, although the CPU 101 detects the suction angle of the component P at the timing immediately before the mounting of the component P (a state where suction nozzle 71 is positioned at mounting position), the disclosure is not limited thereto and the suction angle may be detected at any timing as long as the suction angle is between the time when the component P is sucked and the time when the component P is mounted. For example, when the suction nozzle 71 sucks the component P supplied to the supply position of the component supply device 20 and the suction nozzle 71 is raised (at timing immediately after the suction), the suction angle of the component P may be detected.

In the embodiment described above, although the CPU 101 detects the suction angle with respect to the component P determined to have no height defect, that is, the CPU determines the height defect before executing the angle detection process of the component P, the disclosure is not limited thereto. For example, the CPU 101 may perform the angle detection process for all the components P without determining the height defect.

In the embodiment described above, in a case where the component P in the inclined posture is mounted, although the CPU 101 corrects the mounting position based on the angle correction amount corresponding to the suction angle and performs the mounting of the component P by low-speed operation for lowering the suction nozzle 71 at a lower speed than normal, the disclosure is not limited thereto. For example, although the CPU 101 corrects the mounting position based on the angle correction amount, the CPU 101 may mount the component P in a normal operation or may perform the mounting of the component P at a low-speed operation without performing correction based on the angle correction amount. In addition, the CPU 101 may change the lowering speed in the low-speed operation according to the magnitude of the component suction angle, or may be set to a normal operation up to a predetermined position in the middle of the lowering, and may be made to operate at a lower speed than normal after passing the predetermined position.

In the embodiment described above, although the CPU 101 derives the approximate straight line passing through the lowermost end position Zp and the multiple lower edge positions and detects the angle of the approximate straight line as the suction angle of the component P, the disclosure is not limited thereto, and it suffices as long as it detects the suction angle of the component P based on the lowermost end position Zp and the multiple lower edge positions. For example, the CPU 101 may calculate an average position in a height direction (Z-direction) and a lateral direction (horizontal direction) of multiple lower edge positions, derive a straight line passing through two points of the lowermost end position Zp and the average position, and detect the angle of the straight line as the suction angle of the component P.

In the embodiment described above, although the CPU 101 detects the suction angle of the component P by capturing an image of one side surface of the component P with the side camera 80, the disclosure is not limited thereto, and it is also possible to detect the suction angle of multiple faces of the component P by capturing an image of the side face of the component P over multiple surfaces.

In the embodiment described above, although the component mounting machine 10 includes multiple suction nozzles 71, the disclosure is not limited thereto and the number of the suction nozzles 71 may be one.

INDUSTRIAL APPLICABILITY

The disclosure can be used in a manufacturing industry of component mounting machines and the like.

1: component mounting system, 10: component mounting machine, 20: component supply device, 30: board conveyance device, 50: moving mechanism, 52, 56: guide rail, 54: X-axis slider, 55: X-axis actuator, 58: Y-axis slider, 59: Y-axis actuator, 60: head unit, 70: rotary head, 71: suction nozzle, 72: nozzle holder, 76: R-axis actuator, 77: θ-axis actuator, 78: Z-axis actuator, 79: electromagnetic valve, 80: side camera, 82: camera main body, 84: optical system unit, 90: parts camera, 94: nozzle stocker, 100: control device, 101, 111: CPU, 102, 112: ROM, 103, 113: HDD, 104, 114: RAM, 105, 115: input and output interface, 106, 116: bus, 110: management device, 117: input device, 118: display, P: component, S: board.

The invention claimed is:

1. A component mounting machine comprising:
   a head that has a suction nozzle which sucks a component;
   an imaging device that is disposed on a side of the suction nozzle; and
   an electronic control device that controls the imaging device so as to image the component sucked by the suction nozzle from the side and controls the head so as to mount the component on a mounting target after determining a suction posture of the component based on the image obtained by imaging,
   wherein the electronic control device detects a plurality of positions of lower edges including a lowermost end position of the component from the image, detects a suction angle of the component sucked by the suction nozzle based on a plurality of detection positions including the lowermost end position, and determines the suction posture of the component based on the suction angle,
   wherein the component has a short side in a height direction and a long side in a lateral direction with one corner portion interposed therebetween in a side view, and
   wherein the electronic control device detects the position of the lower edge of the component at predetermined intervals to a left side, detects the position of the lower edge of the component at predetermined intervals to a right side using the lowermost end position as a reference, and sets the position of the lower edge of a side with larger detection number of the left side and the right side and the lowermost end position as the plurality of detection positions.

2. The component mounting machine according to claim 1,
   wherein the electronic control device detects the height of the component based on the lowermost end position to determine whether or not there is height defect of the component, and detects the suction angle with respect to the component that is determined to have no height defect.

3. The component mounting machine according to claim 1,
   wherein the electronic control device obtains an approximate straight line by approximating the plurality of detection positions to a straight line and detects an angle of the approximate straight line with respect to a predetermined reference line as the suction angle.

4. The component mounting machine according to claim 1,
   wherein the electronic control device controls the head so as not to mount the component on the mounting target in a case where the electronic control device determines that the suction posture of the component is defective because the suction angle exceeds a predetermined allowable range.

5. The component mounting machine according to claim 1,
   wherein the electronic control device controls the head so as to mount the component under a predetermined mounting condition in a case where the electronic control device determines that the suction posture of the component is good because the suction angle is a normal angle, and controls the head so as to mount the component under a mounting condition obtained by changing the predetermined mounting condition so as to reduce the influence due to the inclination of the component in a case where the electronic control device determines that the suction posture of the component is inclined because the suction angle is not a normal angle.

6. The component mounting machine according to claim 1, further comprising:
   a moving mechanism that moves the head in a horizontal direction,
   wherein the electronic control device controls a moving mechanism so that the head moves until the suction nozzle sucking the component is positioned at an upper position of a mounting position of the component, controls the imaging device so as to image the component from the side when the suction nozzle is in the upper position, and controls the head so as to lower the suction nozzle from the upper position to the mounting position to mount the component.

7. The component mounting machine according to claim 1,
   wherein the electronic control device controls the imaging device so as to image the suction nozzle in advance in a state where the component is not sucked, detects an angle of a suction surface in which the suction nozzle sucks the component in advance based on the image obtained by the imaging, and determines the suction posture of the component based on a relative angle between the suction angle and an angle of the suction surface when the suction angle of the component is detected.

* * * * *